(12) United States Patent
Kim et al.

(10) Patent No.: US 7,656,984 B2
(45) Date of Patent: Feb. 2, 2010

(54) CIRCUITS AND METHODS FOR RECOVERING A CLOCK SIGNAL

(75) Inventors: Nyun-Tae Kim, Yongin-si (KR); Ki-Hong Kim, Seoul (KR); Kimio Ueda, Seoul (KR); Shu-Jiang Wang, Yongin-si (KR); Mi-Jeong Kim, Yongin-si (KR)

(73) Assignee: Samsung Electronics Co., Ltd, Gyeonggi-do (JP)

( * ) Notice: Subject to any disclaimer, the term of this patent is extended or adjusted under 35 U.S.C. 154(b) by 681 days.

(21) Appl. No.: 11/172,976

(22) Filed: Jul. 5, 2005

(65) Prior Publication Data

US 2006/0008041 A1    Jan. 12, 2006

(30) Foreign Application Priority Data

Jul. 6, 2004    (KR) .................. 10-2004-0052171

(51) Int. Cl.
H03D 3/24    (2006.01)
(52) U.S. Cl. ........................................... 375/373
(58) Field of Classification Search .............. 375/322, 375/354, 357, 369, 372, 373, 374, 371, 72; 370/395.62, 507; 455/265; 702/89; 713/375, 713/400
See application file for complete search history.

(56) References Cited

U.S. PATENT DOCUMENTS 5,864,246 A    1/1999    Anderson

| 6,002,279 | A | 12/1999 | Evans et al. |
| 6,529,052 | B2* | 3/2003 | Wang .......................... 327/120 |
| 6,815,991 | B2* | 11/2004 | Yee et al. ..................... 327/172 |
| 2004/0005869 | A1* | 1/2004 | See et al. .................... 455/102 |
| 2004/0052323 | A1* | 3/2004 | Zhang ......................... 375/375 |
| 2005/0180536 | A1* | 8/2005 | Payne et al. ................. 375/354 |

FOREIGN PATENT DOCUMENTS

| JP | 2001-156631 | 6/2001 |
| KR | 1998-080109 | 11/1998 |
| KR | 2003-0086107 | 11/2003 |

OTHER PUBLICATIONS

Jafar Savoj et al., "Design Of Half-Rate Clock And Data Recovery Circuits For Optical Communication Systems", Jun. 18-22, 2001.

* cited by examiner

*Primary Examiner*—Sam K Ahn
(74) *Attorney, Agent, or Firm*—Harness, Dickey & Pierce, P.L.C.

(57) ABSTRACT

A circuit for recovering a clock signal may include a frequency multiplier configured to generate a plurality of local clock signals, each having a different phase, based on a plurality of received global clock signals at a first frequency and each having a different phase. The local clock signals may be generated at a second frequency higher than the first frequency. The circuit may include a phase interpolator configured to generate a recovered clock signal at a given phase and at a third frequency, based on the generated local clock signals, and a phase shifter configured to adjust the phase of the recovered clock signal so as to synchronize the phase of the recovered clock signal with a phrase of input data that is input to the phase shifter.

39 Claims, 6 Drawing Sheets

CIRCUITS AND METHODS FOR RECOVERING A CLOCK SIGNAL

CLAIM FOR PRIORITY

This application claims priority to Korean Patent Application No. 2004-52171 filed on Jul. 6, 2004 in the Korean Intellectual Property Office (KIPO), the entire contents of which are hereby incorporated by reference.

BACKGROUND OF THE INVENTION

1. Field of the Invention

The present invention relates, in general, to circuits and methods for recovering a clock signal.

2. Description of the Related Art

In general, a clock and data recovery (CDR) circuit provides a clock signal that is used to restore digital signals in a receiver stage of a high-speed data communication system such as an optical communication system, a backplane routing system and/or a chip-to-chip interconnect system, for example. The CDR circuit may recover a clock signal using a reference clock signal provided from a crystal oscillator, or alternatively may recover a clock signal without using a reference clock signal. When a reference clock signal is used to recover the clock signal, an external clock and a clock divider may be employed to generate a clock signal at a frequency equal to a frequency of a bit rate of input data. When the reference clock signal is not used to recover the clock signal, a frequency detector may be employed so as to directly extract frequency information from the input data.

In an example, a half-rate CDR circuit may be employed for high-speed data communication, which has half of a bit rate of the input data. When the half-rate CDR circuit is used, two phase-locked loops (PLL) may be employed to generate a half-rate quadrature clock signal, or alternatively one PLL may be employed to generate a half-rate quadrature clock signal. Using two PLLs may increase a chip area and also may increase power consumption. However, where one PLL is used, a voltage controlled oscillator (VCO) for generating a high frequency is required as the input data rate increases. Additionally, quadrature clock signals at the high frequency need to be transmitted to a receiving channel.

Thus, when the data rate is increased, the use of a single PLL configuration for a CDR circuit may lead to difficulties in designing a complementary metal oxide semiconductor (CMOS) of a PLL/VCO having low jitter characteristics. Moreover, as the clock signal is transmitted to respective channels, a mismatching effect and/or a coupling effect between transmission lines may be increased in proportion to the frequency of the quadrature clock signal. Moreover, power consumption of the transmission buffer may be increased.

In a conventional CDR circuit, one PLL may generate quadrature clock signals of 1.25 GHz, for example, and provide the quadrature clock signals of 1.25 GHz to a phase interpolator. The phase interpolator interpolates a phase of the quadrature clock signals in response to a feedback control signal and generates recovered 1.25 GHz clock signals. The recovered 1.25 GHz clock signals may be used to recover data.

The clock frequency output from the PLL and a recovered clock frequency may be the same. Thus, as the data rate increases to 8.5 Gbps, a PLL/VCO needs to generate an 8.5 GHz clock signal, and must transmit 8.5 GHz quadrature clock signals to the phase interpolator. A half-rate CDR circuit thus needs to transmit 4.25 GHz quadrature clock signals to the phase interpolator.

However, it may be difficult to implement a VCO which generates a frequency in excess of 8 GHz, and which simultaneously satisfies operational reliability, based on the present CMOS technology. Therefore, as data rate increases, it may be difficult to design a low jitter CMOS in a PLL, as mismatching and coupling effects among the clock transmission lines may be increased, and/or because power consumption may increase.

Moreover, where an integrated circuit (IC) for transceiving high-speed data adopts a multi-channel serializer/deserializer (SERDES), a multi-channel clock transmission line for transmitting a high frequency clock signal of a PLL to multiple channels is required. If multi-channel clock transmission lines are required to be designed, the IC adopting the SERDES may also be subject to mismatching and coupling effects among the transmission lines. Additionally, the IC with SERDES may have excessive power consumption in one or more transmission buffers thereof.

Another conventional CDR circuit may include a plurality of PLLs in an effort to reduce the number of transmission buffers, and so as to shorten a length of a transmission line. However, the conventional CDR circuits with multiple PLLs may have a downside in that such a configuration may require greater chip area. Additionally, circuit power consumption may be increased in proportion to the number of PLLs therein.

SUMMARY OF THE INVENTION

An example embodiment of the present invention is directed to a circuit for recovering a clock signal. The circuit may include a frequency multiplier configured to generate a plurality of local clock signals, each having a different phase, based on a plurality of received global clock signals at a first frequency and each having a different phase. The local clock signals may be generated at a second frequency higher than the first frequency. The circuit may include a phase interpolator configured to generate a recovered clock signal at a given phase and at a third frequency, based on the generated local clock signals, and a phase shifter configured to adjust the phase of the recovered clock signal so as to synchronize the phase of the recovered clock signal with a phase of input data that is input to the phase shifter.

Another example embodiment of the present invention is directed to a method for recovering a clock signal. In the method, a plurality of local clock signals may be generated, each having a different phase, based on a plurality of input global clock signals at a first frequency and each having a different phase. The local clock signals may be generated at a second frequency higher than the first frequency. A recovered clock signal may be generated at a given phase and a third frequency, based on the generated local clock signals. The phase of the recovered clock signal may be adjusted so as to synchronize the phase of the recovered clock signal with a phase of input data.

Another example embodiment of the present invention is directed to a frequency multiplier. The frequency multiplier may include an interpolated clock generator configured to generate a plurality of interpolated clock signals from a plurality of global clock signals at a first frequency, each of the interpolated clock signals having a different phase and having a frequency substantially equal to the first frequency of the global clock signals. The frequency multiplier may include a first exclusive OR logic configured to operate an exclusive OR operation on the interpolated global clock signals to generate a pair of first local clock signals the pair of first local clock signals having a phase opposite to each other, and a second exclusive OR logic configured to operate an exclusive OR operation on the interpolated clock signals to generate a pair of second local clock signals, the pair of second local clock signals having a phase opposite to each other.

Another example embodiment of the present invention is directed to a circuit for recovering a clock signal and data. The circuit may include a frequency multiplier generating a plurality of local clock signals from a plurality of received global clock signals, the local clock signals at a frequency higher than a frequency of the received global clock signals, and a phase interpolator generating a recovered clock signal based on the generated local clock signals. The circuit may include a phase shifter adjusting the phase of the recovered clock signal so as to synchronize the phase of the recovered clock signal with a phase of input data that is input to the phase shifter, and generating recovered data based on the synchronized recovered clock signal.

Another example embodiment of the present invention is directed to a method for recovering a clock signal and data. In the method, a plurality of local clock signals may be generated from a plurality of received global clock signals. The local clock signals may be generated at a frequency higher than a frequency of the received global clock signals. A recovered clock signal may be generated based on the generated local clock signals. The phase of the recovered clock signal may be adjusted so as to synchronize the phase of the recovered clock signal with a phase of input data. Recovered data may be generated based on the synchronized recovered clock signal.

Another example embodiment of the present invention is directed to a frequency multiplier. The frequency multiplier may include an interpolated clock generator generating a plurality of interpolated clock signals from a plurality of global clock signals at a frequency substantially equal to a first frequency of the global clock signals. The frequency multiplier may include a first exclusive OR logic performing an exclusive OR operation on the interpolated global clock signals to generate a pair of first local clock signals, and a second exclusive OR logic performing an exclusive OR operation on the interpolated clock signals to generate a pair of second local clock signals. The pair of first local clock signals and the pair of second local clock signals may be generated at a second frequency higher than the first frequency of the global clock signals.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limitative of the example embodiments the present invention.

DETAILED DESCRIPTION OF THE EXAMPLE EMBODIMENTS

Detailed illustrative example embodiments of the present invention are disclosed herein. However, specific structural and functional details disclosed herein are merely representative for purposes of describing example embodiments of the present invention. The invention may, however, be embodied in many alternative forms and should not be construed as limited to the example embodiments set forth herein. Example embodiments of the present invention may thus cover all modifications, equivalents and alternatives falling within the spirit and scope of the present invention. Like numbers refer to like elements throughout the description of the figures.

It should also be noted that in some alternative implementations, the functions/acts noted in the blocks may occur out of the order noted in the flowcharts. For example, two blocks shown in succession may in fact be executed substantially concurrently or the blocks may be executed in the reverse order, depending upon the functionality/acts involved.

As will be described in further detail below, example embodiments of the present invention may be provided to substantially obviate one or more problems due to limitations and/or disadvantages of the related or conventional art CDR circuits. Certain example embodiments to be described hereafter may include a transceiver, circuits and/or methods in which low jitter characteristics, reduced power consumption and/or reduced chip area may be realized. An example circuit or high-speed data transceiver may generate a global clock signal having a frequency lower than a frequency of a recovered clock signal of a respective channel. Accordingly, recovery of data may be realized even with a low-frequency clock signal.

Example embodiments of the present invention also provide a circuit for recovering a clock signal and a method of recovering the clock signal, which may be adaptively used in a high-speed data transceiver, and a frequency multiplier adaptively used in a circuit for recovering a clock signal.

Figure 1:
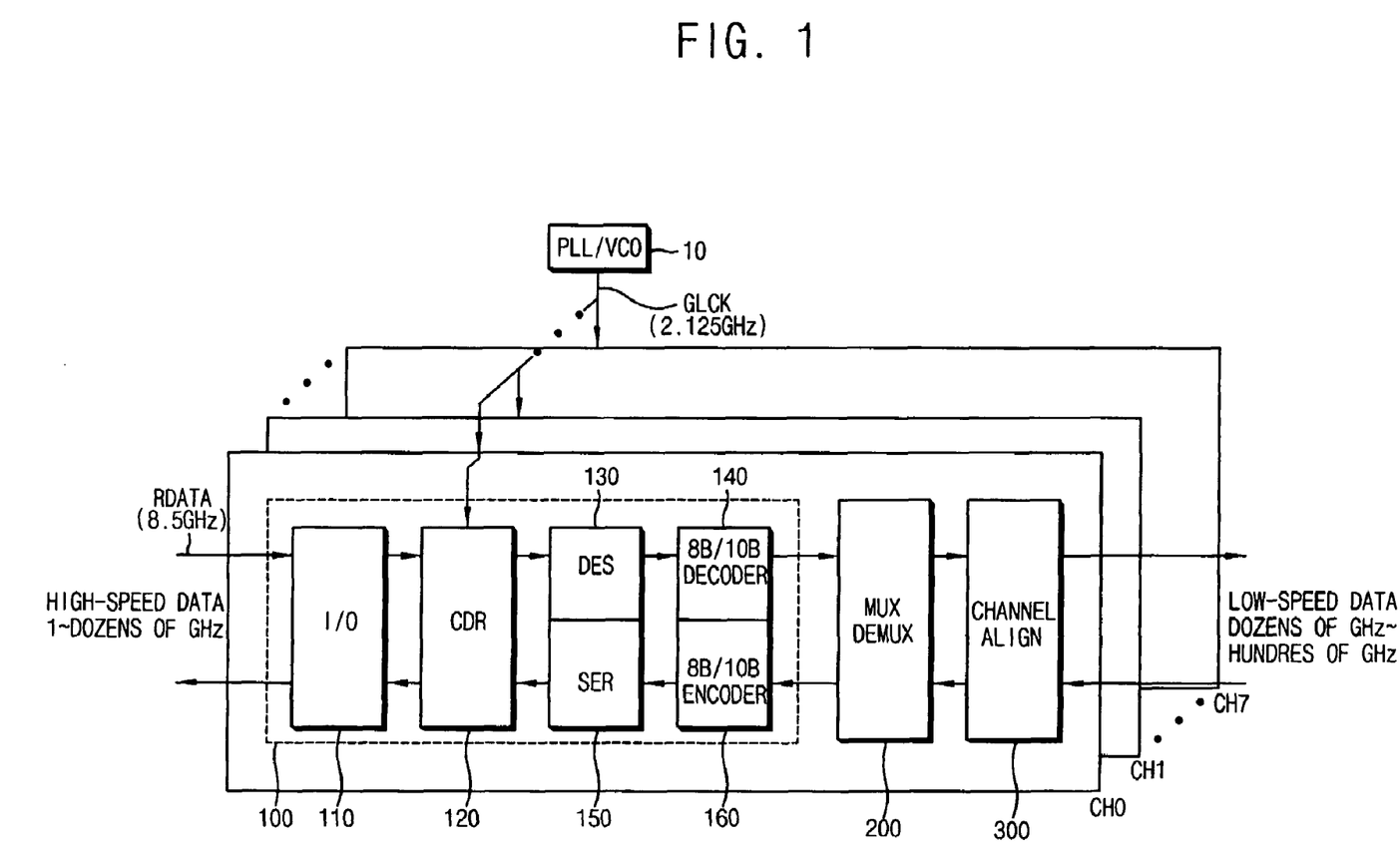
FIG. 1 is a block diagram illustrating an 8-channel high-speed data transceiver according to an example embodiment of the present invention.

FIG. 1 is a block diagram illustrating an example 8-channel high-speed data transceiver according to an example embodiment of the present invention. Referring to FIG. 1, each of channels CH0 to CH7 may receive a global clock (GLCK) signal output from a common phase-locked loop (PLL) 10. In an example, the GLCK signal may have a frequency of about 2.125 GHz, e.g. about a quarter of 8.5 GHz, which corresponds to a frequency of the input high-speed data, shown as the RDATA signal (e.g., input data signal) in FIG. 1.

Each of the channels CH0 through CH7 may include a multi-channel serializer/deserializer (SERDES) block 100, a MUX/DEMUX block 200 and a channel align block 300. The SERDES block 100 may include an input/output 110, a clock and data recovery (CDR) circuit 120, a deserializer 130, an 8B/10B decoder 140, a serializer 150 and an 8B/10B encoder 160, for example. In an example, the multi-channel SERDES block 100 may include 4, 8 or 16 channels. Various components of the CDR circuit 120 are to be described in further detail below.

In the example high-speed data transceiver, the PLL 10 may be thus configured to generate a plurality of global clock (GLCK) signals having a first frequency and a phase, and each of the plurality of channels CH0 to CH7 may include a circuit, such as CDR circuit 120, for recovering a clock signal and data. In an example, each of the global clock (GLCK) signals generated by the PLL 10 may have a different phase. In general, the circuit 120 may be configured to receive the global clock (GLCK) signals from the PLL 10, to generate recovered clock (RECK) signals, and to generate recovered data (REDATA) based on the recovered clock (RECK) signals.

Figure 2:
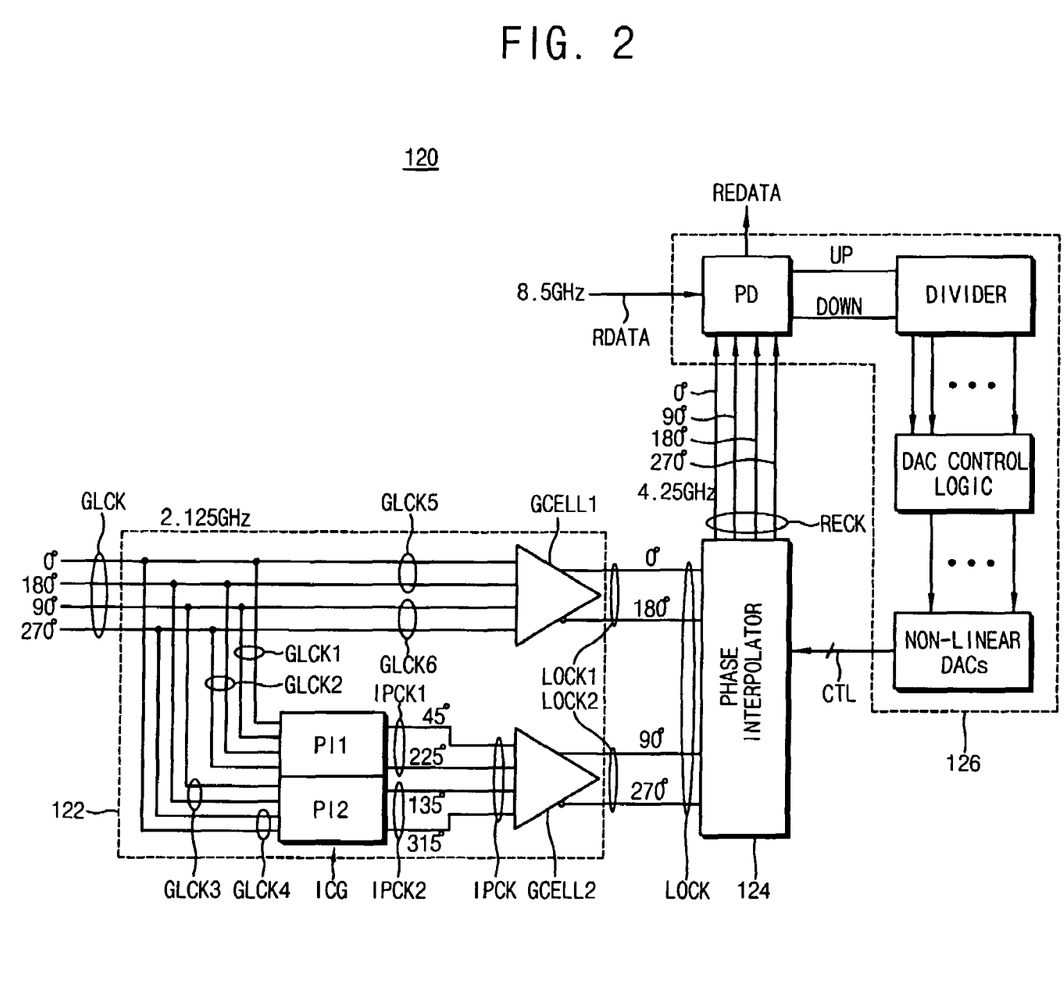
FIG. 2 is a more detailed block diagram illustrating the CDR circuit of FIG. 1.

FIG. 2 is a more detailed block diagram for illustrating the CDR circuit 120 of FIG. 1. Referring to FIG. 2, the CDR circuit 120 may include a frequency multiplier 122. In response to a received quadrature global clock (GLCK) signal having a frequency of about 2.125 GHz, the frequency multiplier 122 may generate a quadrature local clock (LOCK) signal (or channel clock signal) having a frequency of about 4.25 GHz. In an example, each of the local clock (LOCK) signals generated by the frequency multiplier 122 may have a different phase.

The CDR circuit 120 may include a phase interpolator 124. The phase interpolator 124 may include a CMOS analog interpolator as described in U.S. Pat. No. 6,002,279 or U.S. Publication No. 2004/0022339, for example, the entire relevant contents of each of these publications, as related to the description of the phase interpolator, being hereby incorporated by reference herein. The phase interpolator 124 receives the LOCK signal and may generate a 4.25 GHz quadrature recovered clock (RECK) signal in response to an interpolated control (CTL) signal. The RECK signal may be comprised of four clock signals, for example, each respectively having a phase of about 0°, about 90°, about 180° and about 270°.

The CDR circuit 120 may include a phase shifter 126. The phase shifter 126 may include up/down converter, up/down divider, digital-to-analog converter control logic, and a non-linear digital-to-analog converter, such as is disclosed in U.S. Pat. No. 6,002,279. The entire, relevant contents of U.S. Pat. No. 6,002,279, as related to the description of the phase shifter, is hereby incorporated by reference herein. In response to the RECK signal, the phase shifter 126 retimes input data having a frequency of about 8.5 GHz in a half rate and generates recovered data (REDATA).

In addition, after the phase shifter 126 detects a phase difference between the input data signal RDATA and the RECK signal, the phase shifter 126 generates the interpolated control (CTL) signal. The CTL signal is adapted to increase the phase of the RECK signal, if the phase of the RECK signal lags (is behind) a phase of RDATA signal. Additionally, the CTL signal is adapted to decrease the phase of the RECK signal if the phase of the RECK signal leads (is ahead) of the phase of the RDATA signal.

As described above, a conventional phase interpolator and phase shifter, as disclosed in U.S. Pat. No. 6,002,279 and U.S. Publication No. 2004/0022339, may be employed as the phase interpolator 124 and the phase shifter 126. In addition, all modifications, equivalents, and alternatives of the conventional phase interpolator and phase shifter may be employed without departing from the spirit and scope of the present invention.

Accordingly, in an example, the frequency (first frequency) of the global clock (GLCK) signals generated by the PLL 10 and described hereafter may be in a range of about 1 GHz to several GHz, such as several dozens of GHz, for example. The GLCK signals may be used to generate the local clock signals (LOCK) having a frequency (second frequency) higher than that of the GLCK signals. In an example the first frequency may be about 2.125 GHz, the frequency (second frequency) of the local clock signals (LOCK) may be about 4.25 GHz, and the frequency (fourth frequency) of the input data signal RDATA may be about 8.5 GHz.

Referring to FIG. 2, the frequency multiplier 122 may further include an interpolated clock generator (ICG) and Gilbert cells (GCELL1, GCELL2). The Gilbert cells GCELL1 and GCELL 2 will be described in further detail with regard to FIGS. 6-8. The interpolated clock generator (ICG) may further include a first phase interpolator PI1 and a second phase interpolator PI2.

The first phase interpolator PI1 may receive a first pair of global clock (GLCK1) signals having phases of about 0° and about 90°, so as to generate an interpolated clock signal having a phase of about 225°. The first phase interpolator PI1 may also receive a second pair of global clock (GLCK2) signals having phases of about 180° and about 270°, so as to generate an interpolated clock signal having a phase of about 45°. A first pair of interpolated clock (IPCK1) signals may thus include the interpolated clock signal having a phase of about 225° and the interpolated clock signal having a phase of about 45°.

The second phase interpolator PI2 may generate an interpolated clock signal having a phase of about 315° based on receipt of a third pair of global clock (GLCK3) signals having a phase of about 90° and about 180°. The second phase interpolator PI2 may also generate an interpolated clock signal having a phase of about 135° based on receipt of a fourth pair of global clock (GLCK4) signals having a phase of about 270° and about 0°. A second pair of interpolated clock (IPCK2) signals may thus include the interpolated clock signal having a phase of about 315° and the interpolated clock signal having a phase of about 135°.

Figure 3:
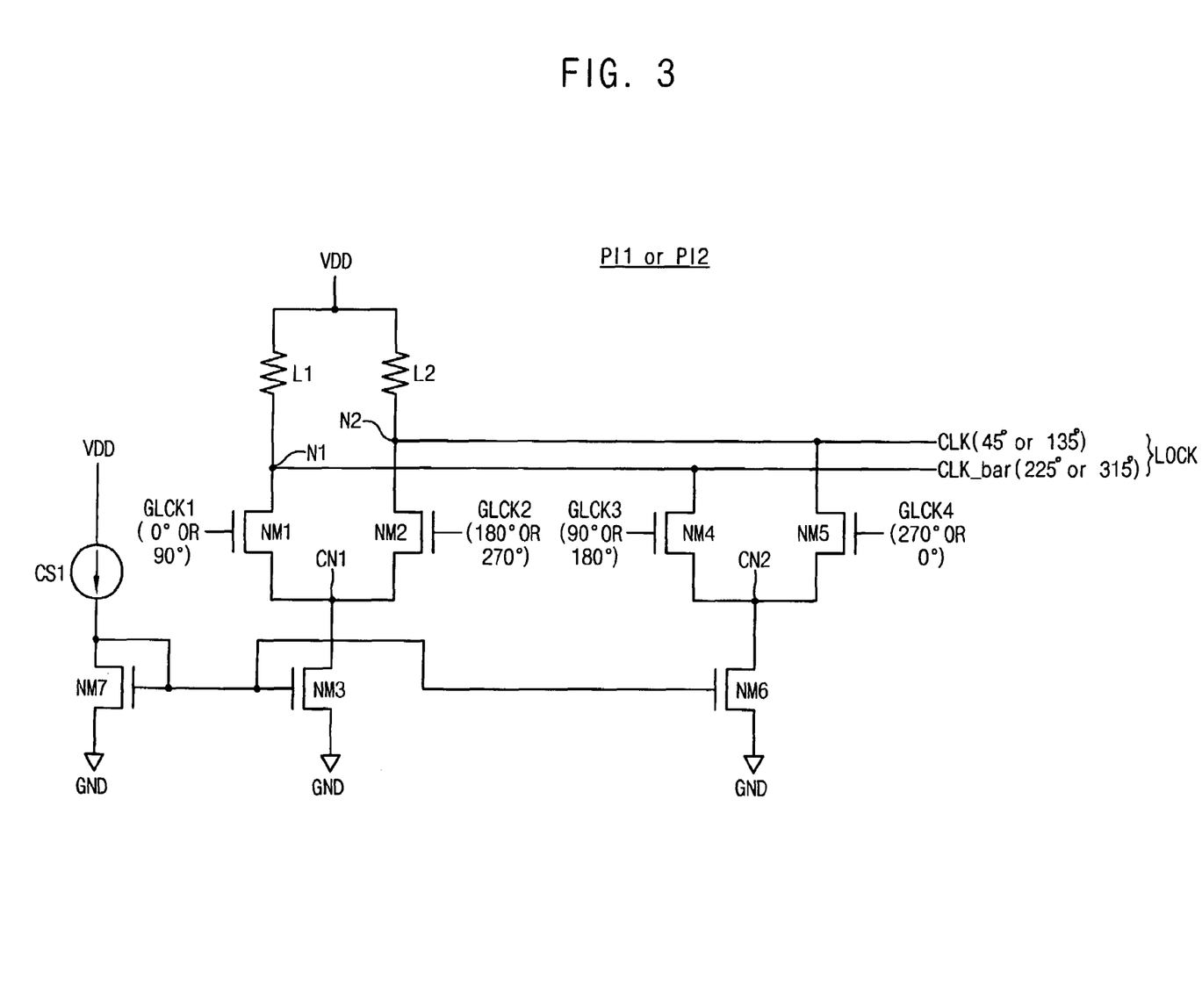
FIG. 3 is a circuit diagram illustrating the example phase interpolator of FIG. 2.

FIG. 3 is a circuit diagram illustrating an example phase interpolator PI1 or PI2 of FIG. 2. In general, the example phase interpolator PI1 or PI2 may include a first differential amplifier configured to differentially amplify a pair of global clock (GLCK) signals having a phase of about 0° or about 180°, and a second differential amplifier configured to differentially amplify a pair of GLCK signals respectively having a phase of about 90° or about 270°. In an example, the differential amplifiers may include a pair of NMOS or a pair of PMOS transistors.

In general, the example phase interpolator PI1 (or PI2) may include a first output load coupled to the first and second differential amplifiers and configured to output an interpolated clock signal having a phase of about 225°. The example phase interpolator PI1 or PI2 may include a second output load coupled to the first and second differential amplifiers and configured to output an interpolated clock signal having a phase of about 45°. The first and second output loads may be implemented using passive loads, such as resistor, or an active load such as an NMOS or a PMOS transistor.

Referring now to FIG. 3, a given phase interpolator PI1 (or PI2) may include two pairs of differential transistors, a first pair (NM1, NM2) and a second pair (NM4, NM5). A common source CN1 of the first pair (NM1, NM2) may be coupled to ground GND via transistor NM3. A pair of output nodes N1 and N2 may be coupled to a supply voltage VDD via a pair of output loads L1 and L2. Respective drains of the first pair (NM1, NM2) may be coupled to the pair of output loads L1 and L2.

A common source CN2 of the second pair (NM4, NM5) may be coupled to the ground GND via transistor NM6. The pair of output nodes N1 and N2 may be coupled to the supply voltage VDD via the pair of output loads L1 and L2. Respective drains of the second pair (NM4, NM5) may be coupled to the pair of output loads L1 and L2, for example.

The transistor NM3 and a transistor NM7, or the transistor NM6 and the transistor NM7, may form a current mirror circuit, for example. The current mirror circuit provides the first pair (NM1, NM2) and second pair (NM4, NM5) with the same bias current generated by a current source CS1.

As shown in FIG. 3 and with occasional reference to FIG. 2, the first pair of interpolated clock signals IPCK1 are output when the first pair of GLCK1 signals are input into respective gates of the differential transistors NM1 and NM4 (the output from output node N1 is represented in this example by CLK signal (45°)), and when the second pair of GLCK2 signals are input into respective gates of the differential transistors NM2 and NM5 (see CLK_bar signal (225°)) output from output node N2 in FIG. 3).

Figure 4:
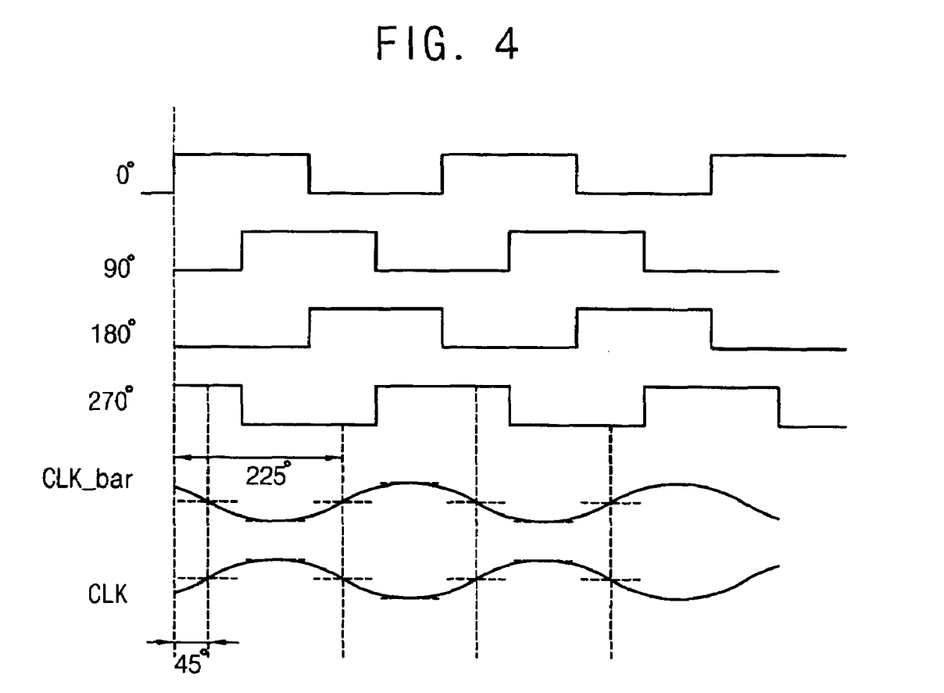
FIG. 4 is a timing diagram illustrating an operation of the PI1 of FIG. 2.

FIG. 4 is a timing diagram illustrating an operation of the phase interpolator PI1 of FIG. 2. Referring to FIG. 4, as the first pair of global clock GLCK1 signals having phases of about 0° and about 90° are both in a high level state, a level of the output node N1 (CLK_bar) is relatively lower than a level of the output node N2 (CLK). As the second pair of global clock GLCK2 signals having phases of about 180° and about 270° are in a high level state, a level of the output node N2 (CLK) is relatively lower than a level of the output node N1 (CLK_bar), as can be seen in FIG. 4.

Therefore, the output node N1 has an output signal with a phase of about 225° which lags (is behind) a phase of about 180° and which leads (is ahead) of a phase of about 270°. The output node N2 has an output signal having a phase of about 45° which is behind about a phase of 0° and ahead of a phase of about 90°. The two output signals have a phase opposite to each other.

When the third pair of global clock signals GLCK3 (respectively having a phase of about 90° or about 180°) are input to corresponding gates of the differential transistors NM1 and NM4, and the fourth pair of global clock signals GLCK4 (respectively having a phase of about 270° and about 0°) are input to corresponding gates of the differential transistors NM2 and NM5, the second pair of interpolated clock signals IPCK2 are output.

Figure 5:
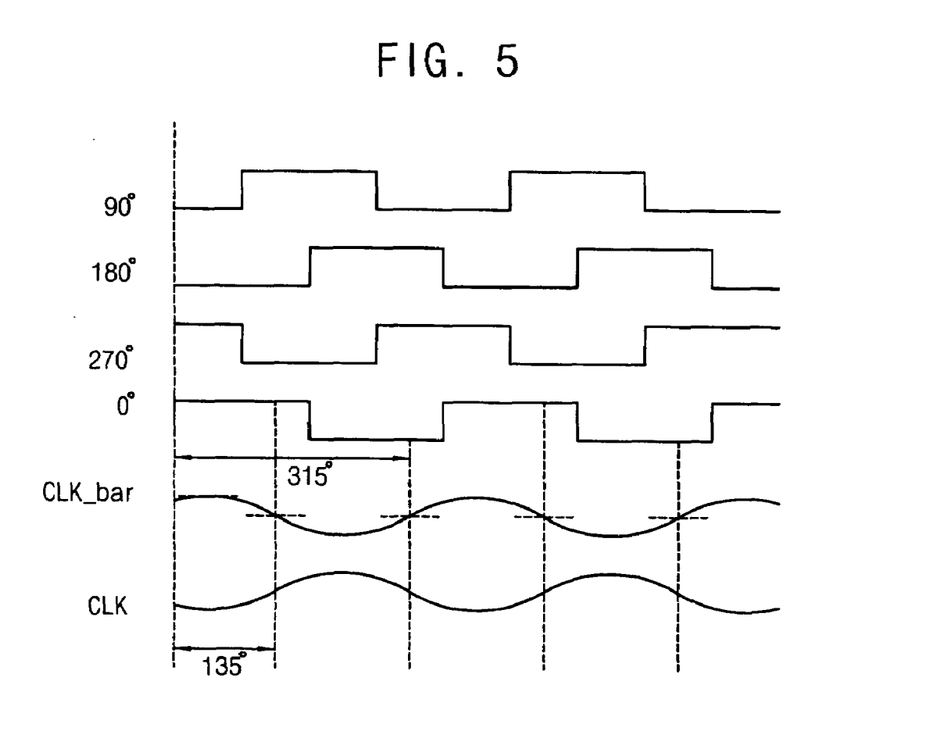
FIG. 5 is a timing diagram illustrating an operation of the PI2 of FIG. 2.

FIG. 5 is a timing diagram illustrating an operation of the phase interpolator PI2 of FIG. 2. Referring to FIG. 5, as the third pair of global clock signals GLCK3 having phases of about 90° and about 180° are in a high level state, a level of the output node N1 (CLK_bar) is relatively lower than a level of the output node N2 (CLK). As the fourth pair of global clock signals GLCK4 having phases of about 270° and about 0° are in a high level state, a level of the output node N2 is relatively lower than a level of the output node N1.

Therefore, the output node N1 has an output signal (CLK-_bar) having a phase of about 315° which is behind (e.g., lags) a phase of about 270° and which leads (is ahead) of a phase of about 0°. The output node N2 has an output signal (CLK) having a phase of about 135° which is behind a phase of about 90° and ahead of a phase of about 180°. The two output signals have a phase opposite to each other, as shown in FIG. 5.

Figure 6:
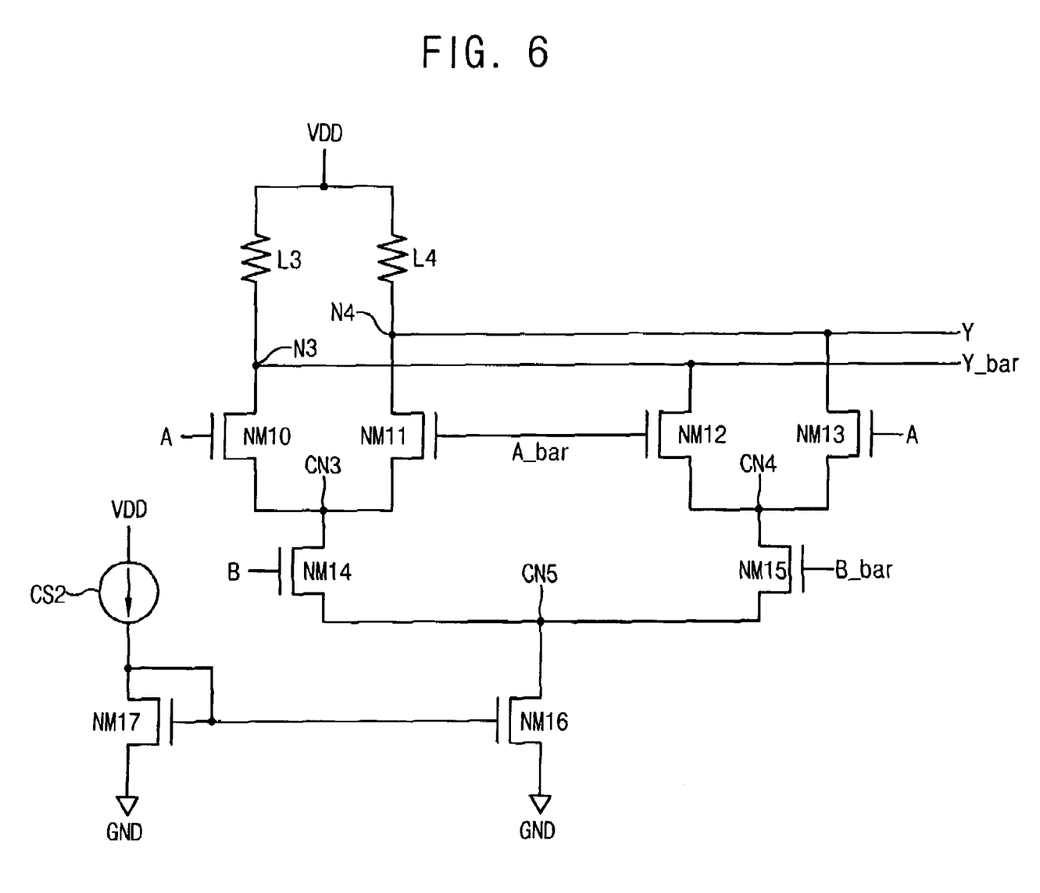
FIG. 6 is a circuit diagram illustrating an example embodiment of the GCELL1 or GCELL2 of FIG. 2.

FIG. 6 is a circuit diagram illustrating an example embodiment of a GCELL1 or a GCELL2 of FIG. 2. Referring to FIG. 6, a given Gilbert cell may include three pairs of differential transistors, a first pair (NM10, NM11), a second pair (NM12, NM13), and a third pair (NM14, NM15). A common source CN5 of the third pair (NM14, NM15) may be coupled to a ground GND via a transistor NM16. Drains of the third pair (NM14, NM15) may be coupled to respective common nodes CN3 and CN4. Sources of the first pair (NM10, NMI1) may be coupled to the common node CN3. Drains of first pair (NMI0, NM11) may be coupled to respective output nodes N3 and N4. Sources of the second pair (NM12, NM13) may be coupled to a common node CN4, and drains of the second pair (NM12, NM13) may be coupled to the respective output nodes N3 and N4. The output nodes N3 and N4 may be coupled to a supply voltage VDD via respective output loads L3 and L4. The transistor NM16 and a transistor NM17 may form a current mirror circuit. The current mirror circuit provides the third pair (NM14, NM15) with the same bias current as generated by a current source CS2.

Figure 7:
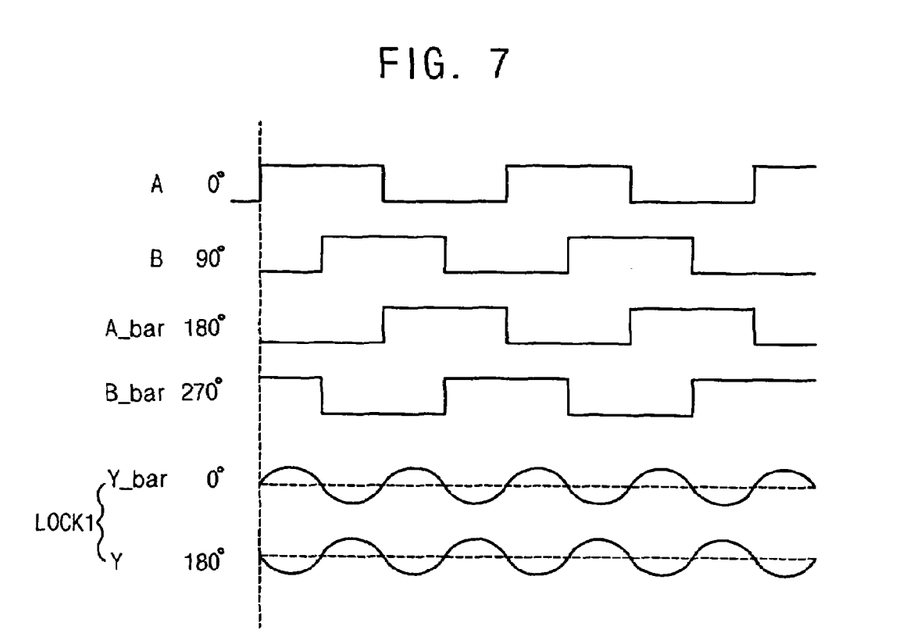
FIG. 7 is a timing diagram illustrating an operation of the GCELL1 of FIG. 2.

As will be shown in FIG. 7, a first pair of local clock signals LOCK1 may be output when the following occur: (a) a signal having a phase of about 0° is applied to respective gates of the transistors NM10 and NM13, (b) a signal having a phase of about 180° is applied to respective gates of the transistors NMI1 and NM12, (c) a signal having a phase of about 90° is applied to a gate of the transistor NM14, and (d) a signal having a phase of about 270° is applied to a gate of the transistor NM15. In other words, the first pair of local clock signals LOCK1 are output when a fifth pair of global clock signals GLCK5 is applied to the first and second pairs of differential transistors (NM10, NM11) and (NM12, NM13) and a sixth pair of global clock signals GLCK6 is applied to the third pair of differential transistors NM14 and NM15 (not shown for reasons of clarity, but in somewhat similar fashion to as shown in FIG. 3 for the first through fourth pairs of global clock signals GLCK1-GLCK4).

FIG. 7 is a timing diagram illustrating an operation of the GCELL1 of FIG. 2. Referring to FIG. 7, as the global clock (GLCK) signals respectively with a phase of about 0° and about 90° (shown as signals A and B in FIG. 7) are in a level state different to each other, a level of the output node N3 (see Y_bar signal in FIG. 7) is relatively higher than that of the output node N4 (see Y signal in FIG. 7). As the global clock (GLCK) signals A (phase of about 0°) and B (phase of about 90°) are in a same level state as each other, a level of the output node N3 is relatively lower than that of the output node N4.

Therefore, an output signal (Y_bar) with a doubled frequency and a phase of about 0° is output at output node N3. An output signal (Y) having a doubled frequency and a phase of about 180° is output at output node N4. A frequency of the two output signals is doubled, as compared to a frequency of the respective input signals. Respective phases of the two output signals are opposite to each other.

As will be described in further detail with respect to FIG. 8, a second pair of local clock signals LOCK2 may be output when the following occur: (a) a signal having a phase of about 45° is applied to respective gates of the transistors NM10 and NM13, (b) a signal having a phase of about 225° is applied to respective gates of the transistors NM11 and NM12, (c) a signal having a phase of about 135° is applied to a gate of the transistor NM 14, and (d) a signal having a phase of about 315° is applied to a gate of the transistor NM15. In other words, the second pair of local clock signals LOCK2 may be output when the first pair of interpolated clock signals IPCK1 are applied to the first and second pairs of differential transistors (NM10, NM11) and (NM12, NM13) and the second pair of interpolated clock signals IPCK2 are applied to the third pair of differential transistors NM14 and NM15.

Figure 8:
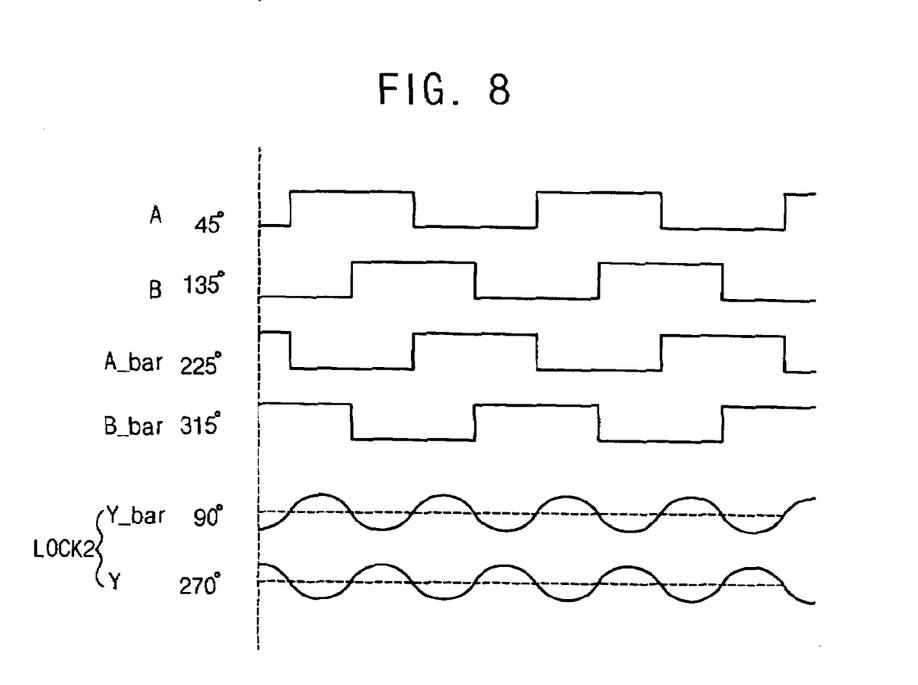
FIG. 8 is a timing diagram illustrating an operation of the GCELL2 of FIG. 2.

FIG. 8 is a timing diagram illustrating an operation of the GCELL2 of FIG. 2. As shown in FIG. 8, as the global clock (GLCK) signals, denoted as A in FIG. 8 (having a phase of about 45°) or B (phase of about 135°) are in different level states, a level of the output node N3 (Y_bar in FIG. 8) is relatively higher than that of the output node N4 (see Y in FIG. 8). While the global clock (GLCK) signals A and B in FIG. 8 are in the same level state, a level of the output node N3 is relatively lower than that of the output node N4, as can be seen in FIG. 8.

Therefore, an output signal (Y_bar) with a doubled frequency and a phase of about 90° may be output at output node N3. An output signal (Y) with a doubled frequency and a phase of about 270° may be generated at output node N4. A frequency of the two output signals A and B is doubled, as compared with that of respective input signals, and respective phases of the two output signals A and B may be opposite to each other. Accordingly, the frequency multiplier 122 thus receives the 2.125 GHz quadrature global clock (GLCK) signal to generate the doubled 4.25 GHz quadrature local clock (LOCK) signal, as described above.

Referring to FIG. 2, the phase interpolator 124 then interpolates a phase of the local 4.25 GHz quadrature clock signal LOCK so as to follow a phase of the 8.5 GHz input data signal RDATA, in response to the interpolated control signal (CTL), and generates the 4.25 GHz quadrature recovered clock signal (RECK). In other words, and based on the interpolated control (CTL) signal, the generated RECK signal is synchronized so as to be in phase with the input RDATA signal. Based on the generated RECK signal, the phase shifter 126 recovers the 8.5 GHz input RDATA signal in half-rate so as generate the recovered data REDATA, as shown in FIG. 2.

As shown in FIG. 2, the phase shifter 126 converts any phase difference between the input data RDATA and the RECK signal into an up/down signal, and generates the CTL signal in response to the up/down signal. The interpolated control (CTL) signal is thus applied to the phase shifter 124 so that phase of the recovered clock RECK is either increased (if it lags the phase of the RDATA signal) or decreased (if it leads the phase of the RDATA signal), thus synchronizing the phases of the two signals for data recovery and generation of the recovered data signal REDATA.

Thus in the example embodiments, one PLL 10 may generate global clock signals GLCK having a frequency lower than a frequency of the recovered clock signal RECK, so as to transmit the global clock signal to respective channels CH0-CH7. Each of the channels CH0-CH7 may perform a frequency multiplexing operation on the GLCK to generate a local clock signal (LOCK) having a frequency higher than the frequency of the global clock signal (GLCK). In other words, since the PLL 10 generates a low-frequency clock signal, low jitter characteristics may be realized and a power consumption of the PLL may be reduced.

The high-speed data transceiver shown in FIG. 1 may include 40 GHz of an optical channel interface, 10 GHz through 20 GHz of an Ethernet interface, or a high-speed serial backplane data transmitting device, for example.

As discussed above, in an example the frequency of the global clock signals (GLCK) may be about 2.125 GHz, the frequency of the local clock signals (LOCK) may be about 4.25 GHz and the frequency of the input data signal (RDATA) may be about 8.5 GHz. Thus, in a half-rate recovering methodology, a clock frequency of a PLL (such as the PLL 10 in FIG. 1) may be reduced to a ¼ of frequency of the input data signal RDATA. In a quadrature rate recovering methodology, a clock frequency of the PLL may be reduced into a ⅛ of the 8.5 GHz frequency of the input data. Thus, it may be possible to design a 2.125 GHz PLL/VCO as shown in FIG. 1, and low jitter characteristics may be realized when recovering input data, since the global clock frequency (2.125 GHz) of PLL/VCO is lower than 4 GHz.

As discussed above the example global clock (GLCK) signals may be a quadrature clock signals having phases of about 0°, about 90°, about 180° and about 270°. The global clock signals may be provided from one PLL. Thus, the clock frequency of the PLL may be reduced by half (2.125 GHz) of the 4.25 GHz frequency in a half rate CDR circuit implementation, for example. Although example frequencies for one or more of the global clock signals, local clock signals, input data signals and recovered clock signals have been described for purposes of explanation, it would be evident to one of ordinary skill in the art to generate clock and/or data signals at other and/or different frequencies than described herein.

According to the above example embodiments of the present invention, since one PLL is employed to transmit a global clock signal having a frequency that is half of a frequency of a half-rate CDR circuit to respective channels CH0 to CH7, a recovery of data may be realized even by a low-frequency clock signal. In addition, any mismatching and/or coupling effects between transmission lines, as well as power consumption, may be reduced and/or minimized. Further, because a PLL for generating a low-frequency clock signal is employed, low jitter characteristics may be realized, which also may reduce power consumption requirements of the PLL. Moreover, as only a single PLL need be employed and low frequency transmission is realized, the number of transmission buffers required may be reduced, thereby reducing the chip area that is required.

While the example embodiments of the present invention have been particularly shown and described, it will be understood by those of ordinary skill in the art that various changes in form and details may be made therein without departing from the spirit and scope of the example embodiments of the present invention, as defined by the following claims.

What is claimed is:

1. A circuit for recovering a clock signal, comprising:
a frequency multiplier configured to generate a plurality of local clock signals, each having a different phase, based on a plurality of received global clock signals at a first frequency and each having a different phase, the local clock signals at a second frequency higher than the first frequency,
a phase interpolator configured to generate a recovered clock signal at a given phase and at a third frequency, based on the generated local clock signals, and
a phase shifter configured to adjust the phase of the recovered clock signal so as to synchronize the phase of the recovered clock signal with a phase of input data that is input to the phase shifter.

2. The circuit of claim 1, wherein
the phase interpolator obtains the phase of the recovered clock signal by interpolating phases of at least two of the local clock signals, and
the third frequency is substantially equal to the second frequency of the local clock signals.

3. The circuit of claim 1, wherein the phase shifter is adapted to
increase the phase of the recovered clock signal if the phase of the recovered clock signal is behind a phase of the input data, and
decrease the phase of the recovered clock signal if the phase of the recovered clock signal is ahead of the phase of the input data.

4. The circuit of claim 1, wherein the first frequency of the global clock signals is in a range from about 1 GHz to several GHz.

5. The circuit of claim 1, wherein a frequency of the input data represents a fourth frequency that is higher than the second frequency of the local clock signals.

6. The circuit of claim 5, wherein the first frequency is about 2.125 GHz, the second frequency is about 4.25 GHz and the fourth frequency is about 8.5 GHz.

7. The circuit of claim 1, wherein the recovered clock signal corresponds to a clock signal of each of a plurality of channels of a multi-channel serializer/deserializer (SERDES).

8. The circuit of claim 1, wherein the phase shifter includes a non-linear digital-to-analog converter.

9. The circuit of claim 1, wherein the frequency multiplier includes:
   an interpolated clock generator configured to generate a plurality of interpolated clock signals based on the global clock signals, each of the interpolated clock signals having a different phase and the interpolated clock signals having a frequency substantially equal to the first frequency of the global clock signals,
   a first Gilbert cell configured to perform an exclusive OR operation on the global clock signals to generate a pair of first local clock signals from the local clock signals, the pair of first local clock signals having a phase opposite to each other, and
   a second Gilbert cell configured to perform the exclusive OR operation of the interpolated clock signals to generate a pair of second local clock signals from the local clock signals, the pair of second local clock signals having a phase opposite to each other.

10. The circuit of claim 9, wherein each of the global clock signals has a phase corresponding to one of about 0°, about 90°, about 180° and about 270°.

11. The circuit of claim 10, wherein each of the interpolated clock signals has a phase corresponding to one of about 45°, about 135°, about 225° and about 315°.

12. The circuit of claim 11, wherein the interpolated clock generator includes:
   a first phase interpolator configured to interpolate the global clock signals to generate a first pair of interpolated clock signals at respective phases of about 45° or about 225°, and
   a second phase interpolator configured to interpolate the global clock signals to generate a second pair of interpolated clock signals having respective phases of about 135° or about 315°.

13. The circuit of claim 12, wherein the first phase interpolator includes:
   a first differential amplifier configured to differentially amplify a pair of global clock signals respectively having a phase of about 0° or about 180° from the plurality of global clock signals,
   a second differential amplifier configured to differentially amplify a pair of global clock signals respectively having a phase of about 90° or about 270° from the plurality of global clock signals,
   a first output load commonly coupled to first output terminals of the first and second differential amplifiers and configured to output the interpolated clock signal having a phase of about 225° from the first pair of interpolated clock signals, and
   a second output load commonly coupled to second output terminals of the first and second differential amplifiers and configured to output the interpolated clock signal having a phase of about 45° from the second pair of interpolated clock signals.

14. The circuit of claim 12, wherein the second phase interpolator includes:
   a first differential amplifier configured to differentially amplify a pair of global clock signals respectively having a phase of about 90° or about 270° from the plurality of global clock signals,
   a second differential amplifier configured to differentially amplify a pair of global clock signals respectively having a phase of about 180° or about 0° from the plurality of global clock signals,
   a first output load commonly coupled to first output terminals of the first and second differential amplifiers and configured to output the interpolated clock signal having a phase of about 315° from the second pair of interpolated clock signals, and
   a second output load commonly coupled to second output terminals of the first and second differential amplifiers and configured to output the interpolated clock signal having a phase of about 135° from the second pair of interpolated clock signals.

15. A method for recovering a clock signal, comprising:
   generating a plurality of local clock signals, by a frequency multiplier, each having a different phase, based on a plurality of input global clock signals at a first frequency and each having a different phase, the local clock signals generated at a second frequency higher than the first frequency,
   generating a recovered clock signal at a given phase and a third frequency, by a phase interpolator, based on the generated local clock signals, and
   adjusting the phase of the recovered clock signal, by a phase shifter, so as to synchronize the phase of the recovered clock signal with a phase of input data.

16. The method of claim 15, wherein
   generating the recovered clock signal includes obtaining the phase of the recovered clock signal by interpolating phases of at least two of the local clock signals, and
   the third frequency of the generated recovered clock signal is substantially equal to the second frequency of the local clock signals.

17. The method of claim 15, wherein adjusting includes:
   increasing the phase of the recovered clock signal if the phase of the recovered clock signal is behind a phase of the input data, and
   decreasing the phase of the recovered clock signal if the phase of the recovered clock signal is ahead of the phase of the input data.

18. The method of claim 15, wherein the first frequency of the global clock signals is in a range from about 1 GHz to several GHz.

19. The method of claim 15, wherein frequency of the input data represents a fourth frequency that is higher than the second frequency.

20. The method of claim 19, wherein the first frequency is about 2.125 GHz, the second frequency is about 4.25 GHz and the fourth frequency is about 8.5 GHz.

21. The method of claim 15, wherein generating the plurality of local clock signals includes:
   generating a plurality of interpolated clock signals based on the global clock signals, each of the interpolated clock signals having a different phase and the interpolated clock signals having a frequency substantially equal to the first frequency of the global clock signals,
   generating a pair of first local clock signals from the local clock signals based on the global clock signals, the pair of first local clock signals having a phase opposite to each other, and
   generating a pair of second local clock signals from the local clock signals based on the interpolated clock signals, the pair of second local clock signals having a phase opposite to each other.

22. The method of claim 21, wherein each of the global clock signals has a phase corresponding to one of about 0°, about 90°, about 180° and about 270°.

23. The method of claim 22, wherein each of the interpolated clock signals has a phase corresponding to one of about 45°, about 135°, about 225 and about 315°.

24. The method of claim 23, wherein generating the plurality of interpolated clock signals includes:
  interpolating the global clock signals to generate a first pair of interpolated clock signals respectively having the phase of about 45° or about 225°, and
  interpolating the global clock signals to generate a second pair of interpolated clock signals having the phase of about 135° or about 315°.

25. The method of claim 24, wherein interpolating the global clock signals to generate the first pair of interpolated clock signals includes:
  differentially amplifying a pair of global clock signals respectively having a phase of about 0° or about 180° from the global clock signals to generate a first pair of output signals having a phase opposite to each other,
  differentially amplifying a pair of global clock signals respectively having a phase of about 90° or about 270° from the global clock signals to generate a second pair of output signals having a phase opposite to each other,
  mixing first and second output signals corresponding to the global clock signals respectively having a phase of one of about 0° and about 90° to output the interpolated clock signal having a phase of about 225° from the first pair of interpolated clock signals, and
  mixing third and fourth output signals corresponding to the global clock signals having a phase of one of about 180° and about 270° to output the interpolated clock signal having the phase of about 45° from the second pair of interpolated clock signals.

26. The method of claim 22, wherein interpolating the global clock signals to generate the second pair of interpolated clock signals includes:
  differentially amplifying a pair of global clock signals respectively having a phase of about 90° or about 270° from the global clock signals to generate a first pair of output signals having a phase opposite to each other,
  differentially amplifying a pair of global clock signals respectively having a phase of about 180° or about 0° from the global clock signals to generate a second pair of output signals having a phase opposite to each other,
  mixing first and second output signals corresponding to the global clock signals respectively having a phase of one of about 90° and about 180° to output the interpolated clock signal having a phase of about 315° from the second pair of interpolated clock signals, and
  mixing third and fourth output signals corresponding to the global clock signals respectively having a phase of one of about 270° and about 0° to output the interpolated clock signal having a phase of about 135° from the second pair of interpolated clock signals.

27. A high-speed data transceiver, comprising:
  a phase-locked loop configured to generate a plurality of global clock signals at a first frequency, each of the global clock signals having a different phase, and
  a plurality of channels, each channel including a circuit for recovering a clock signal, the circuit including:
    a frequency multiplier configured to generate a plurality of local clock signals, each having a different phase, based on the plurality of global clock signals at the first frequency and each having the different phase, the local clock signals at a second frequency higher than the first frequency,
    a phase interpolator configured to generate a recovered clock signal at a given phase and at a third frequency, based on the generated local clock signals, and
    a phase shifter configured to adjust the phase of the recovered clock signal so as to synchronize the phase of the recovered clock signal with a phase of input data that is input to the phase shifter.

28. The high-speed data transceiver of claim 27, further comprising a multi-channel serializer/deserializer (SERDES).

29. A frequency multiplier, comprising:
  an interpolated clock generator configured to generate a plurality of interpolated clock signals from a plurality of global clock signals at a first frequency, each of the interpolated clock signals having a different phase and having a frequency substantially equal to the first frequency of the global clock signals,
  a first Gilbert cell configured to operate an exclusive OR operation on the interpolated global clock signals to generate a pair of first local clock signals the pair of first local clock signals having a phase opposite to each other, and
  a second Gilbert cell configured to operate an exclusive OR operation on the interpolated clock signals to generate a pair of second local clock signals, the pair of second local clock signals having a phase opposite to each other.

30. The frequency multiplier of claim 29, wherein the pair of first local clock signals and the pair of second local clock signals are generated at a second frequency higher than the first frequency of the global clock signals.

31. The frequency multiplier of claim 29, wherein the interpolated clock generator includes:
  a first phase interpolator configured to interpolate the global clock signals to generate a first pair of interpolated clock signals respectively having the phase of about 45° or about 225°, and
  a second phase interpolator configured to interpolate the global clock signals to generate a second pair of interpolated clock signals having the phase of about 135° or about 315°.

32. The frequency multiplier of claim 31, wherein the first phase interpolator includes:
  a first differential circuit configured to differentially amplify a pair of global clock signals respectively having a phase of about 0° or about 180° from the plurality of global clock signals,
  a second differential circuit configured to differentially amplify a pair of global clock signals respectively having a phase of about 90° or about 270° from the plurality of global clock signals,
  a first output load commonly coupled to first output terminals of the first and second differential amplifier and configured to output the interpolated clock signal having a phase of about 225° from the first pair of interpolated clock signals, and
  a second output load commonly coupled to second output terminals of the first and second differential amplifiers and configured to output the interpolated clock signal having a phase of about 45° from the second pair of interpolated clock signals.

33. The frequency multiplier of claim 31, wherein the second phase interpolator includes:

a first differential circuit configured to differentially amplify a pair of global clock signals respectively having a phase of about 90° or about 270° from the plurality of global clock signals, a second differential circuit configured to differentially amplify a pair of global clock signals respectively having a phase of about 180° or about 0° from the plurality of global clock signals, a first output load commonly coupled to first output terminals of the first and second differential amplifiers and configured to output an interpolated clock signal having a phase of about 315° from the second pair of interpolated clock signals, and a second output load commonly coupled to second output terminals of the first and second differential amplifiers and configured to output an interpolated clock signal having a phase of about 135° from the second pair of interpolated clock signals.

34. A circuit for recovering a clock signal and data, comprising:

a frequency multiplier generating a plurality of local clock signals from a plurality of received global clock signals, the local clock signals at a frequency higher than a frequency of the received global clock signals, a phase interpolator generating a recovered clock signal based on the generated local clock signals, and a phase shifter adjusting the phase of the recovered clock signal so as to synchronize the phase of the recovered clock signal with a phase of input data that is input to the phase shifter, and generating recovered data based on the synchronized recovered clock signal.

35. A method for recovering a clock signal and data, comprising:

generating a plurality of local clock signals from a plurality of received global clock signals, by a frequency multiplier, the local clock signals at a frequency higher than a frequency of the received global clock signals, generating a recovered clock signal based on the generated local clock signals by a phase interpolator, adjusting the phase of the recovered clock signal, by a phase shifter, so as to synchronize the phase of the recovered clock signal with a phase of input data, and generating recovered data, by the phase shifter, based on the synchronized recovered clock signal.

36. A high-speed data transceiver, comprising:

a phase-locked loop configured to generate a plurality of global clock signals at a given frequency, and a plurality of channels, each channel including a circuit for recovering a clock signal and data, the circuit including:

a frequency multiplier generating a plurality of local clock signals from the plurality of global clock signals, the local clock signals at a frequency higher than a frequency of the global clock signals, a phase interpolator generating a recovered clock signal based on the generated local clock signals, and a phase shifter adjusting the phase of the recovered clock signal so as to synchronize the phase of the recovered clock signal with a phase of input data that is input to the phase shifter, and generating recovered data based on the synchronized recovered clock signal.

37. A frequency multiplier, comprising:

an interpolated clock generator generating a plurality of interpolated clock signals from a plurality of global clock signals at a frequency substantially equal to a first frequency of the global clock signals.

a first Gilbert cell performing an exclusive OR operation on the interpolated global clock signals to generate a pair of first local clock signals, and a second Gilbert cell performing an exclusive OR operation on the interpolated clock signals to generate a pair of second local clock signals, wherein the pair of first local clock signals and the pair of second local clock signals are generated at a second frequency higher than the first frequency of the global clock signals.

38. A circuit for recovering a clock signal, comprising:

a frequency multiplier, the frequency multiplier including:

an interpolated clock generator configured to generate a plurality of interpolated clock signals from a plurality of global clock signals at a first frequency, each of the interpolated clock signals having a different phase and having a frequency substantially equal to the first frequency of the global clock signals, a first Gilbert cell configured to operate an exclusive OR operation on the interpolated global clock signals to generate a pair of first local clock signals the pair of first local clock signals having a phase opposite to each other, and a second Gilbert cell configured to operate an exclusive OR operation on the interpolated clock signals to generate a pair of second local clock signals, the pair of second local clock signals having a phase opposite to each other;

a phase interpolator configured to generate a recovered clock signal at a given phase and at a third frequency, based on the generated local clock signals, and a phase shifter configured to adjust the phase of the recovered clock signal so as to synchronize the phase of the recovered clock signal with a phase of input data that is input to the phase shifter.

39. A circuit for recovering a clock signal and data, comprising:

a frequency multiplier, the frequency multiplier including:

an interpolated clock generator generating a plurality of interpolated clock signals from a plurality of global clock signals at a frequency substantially equal to a first frequency of the global clock signals, a first Gilbert cell performing an exclusive OR operation on the interpolated global clock signals to generate a pair of first local clock signals, and a second Gilbert cell performing an exclusive OR operation on the interpolated clock signals to generate a pair of second local clock signals, wherein the pair of first local clock signals and the pair of second local clock signals are generated at a second frequency higher than the first frequency of the global clock signals;

a phase interpolator generating a recovered clock signal based on the generated local clock signals, and a phase shifter adjusting the phase of the recovered clock signal so as to synchronize the phase of the recovered clock signal with a phase of input data that is input to the phase shifter, and generating recovered data based on the synchronized recovered clock signal.

* * * * *